(12) United States Patent
Liu et al.

(10) Patent No.: US 9,312,866 B2
(45) Date of Patent: Apr. 12, 2016

(54) PHASE LOCK LOOP (PLL/FLL) CLOCK SIGNAL GENERATION WITH FREQUENCY SCALING TO POWER SUPPLY VOLTAGE

(71) Applicant: NVIDIA Corporation, Santa Clara, CA (US)

(72) Inventors: Tao Liu, San Jose, CA (US); Jawid Aziz, Fremont, CA (US); Albert Harjono, Milpitas, CA (US)

(73) Assignee: NVIDIA Corporation, Santa Clara, CA (US)

( * ) Notice: Subject to any disclaimer, the term of this patent is extended or adjusted under 35 U.S.C. 154(b) by 90 days.

(21) Appl. No.: 14/165,444

(22) Filed: Jan. 27, 2014

(65) Prior Publication Data

US 2015/0214963 A1    Jul. 30, 2015

(51) Int. Cl.
*H03L 7/06* (2006.01)
*H03L 7/085* (2006.01)

(52) U.S. Cl.
CPC ...................... *H03L 7/085* (2013.01)

(58) Field of Classification Search
CPC ..... H03L 2207/50; H03L 7/0995; H03L 7/18; H03L 7/148; H03L 7/085; H03L 7/091; H03L 7/097
USPC ................................................ 327/156, 158
See application file for complete search history.

(56) References Cited

U.S. PATENT DOCUMENTS

| | | | |
|---|---|---|---|
| 6,289,208 B1 * | 9/2001 | Hareyama | 455/260 |
| 7,042,259 B2 | 5/2006 | Kurd et al. | |
| 7,616,075 B2 * | 11/2009 | Kushiyama | H03L 7/0893 331/186 |
| 7,764,095 B2 * | 7/2010 | Werner et al. | 327/158 |
| 8,428,212 B2 * | 4/2013 | Grewing et al. | 375/376 |
| 2008/0096490 A1 * | 4/2008 | Okazaki | H04B 1/403 455/76 |
| 2014/0254734 A1 * | 9/2014 | Abdelmoneum | H03L 7/0995 375/376 |

OTHER PUBLICATIONS

Kurd et al., "Next Generation Intel Micro-architecture (Nehalem) Clocking Architecture", 2008 Symposium on VLSI Circuits Digest of Technical Papers, pp. 62-63.

* cited by examiner

*Primary Examiner* — Diana J Cheng
(74) *Attorney, Agent, or Firm* — Zilka-Kotab, PC

(57) ABSTRACT

A clock signal generation circuit provides an output clock signal to a digital system. The digital system is powered by a power supply voltage, VDD, that may include transients associated with the impedance of the packaged digital system. The clock signal generation circuit dynamically scales an output clock frequency based on monitored changed to VDD. The output clock frequency may be selected to approximate a maximum (margin-less) system Fmax for the monitored VDD. The average clock frequency may be improved compared with operating at a fixed output clock frequency.

20 Claims, 6 Drawing Sheets

PHASE LOCK LOOP (PLL/FLL) CLOCK SIGNAL GENERATION WITH FREQUENCY SCALING TO POWER SUPPLY VOLTAGE

FIELD OF THE INVENTION

The present invention is generally related to techniques to modify the output clock frequency of a clock signal generation circuit to address the problems caused by voltage droop and overshoot of a power supply.

BACKGROUND OF THE INVENTION

FIG. 1 illustrates a conventional Phase Locked Loop (PLL) clock signal generation circuit 100 of the prior art. A PLL 105 used to generate a clock signal 106 from an input clock reference signal 107. A similar clock signal generation circuit 100 without PFD (110) is also sometimes described as a Frequency Locked Loop (FLL).

A PLL is typically used in digital system to provide a clock signal having a frequency programmed at the operating frequency of the digital system, as shown in FIG. 1. The PLL circuit includes a Phase Frequency Detector (PFD) 110, charge pump 115, loop filter 120, voltage controlled oscillator 125, and a divider 130.

A conventional PLL/FLL generates clock signals having a frequency that is a fixed multiple of an input reference clock frequency. The output clock frequency (Fout) is determined by following formula:

$$Fout = Fin \times N.$$

A problem with a conventional PLL/FLL clock generation circuit is that a fixed output clock frequency is not efficient for a digital system with significant power supply noise. In particular, the power supply voltage can droop and overshoot when the digital system switches on and off. This is because the system impedance includes a die capacitance and a packaging inductance. Typically the system impedance has $1^{st}$ and $2^{nd}$ order droops, where the $1^{st}$ order droop occurs at a much higher range of frequencies than the $2^{nd}$ order droops.

For many digital circuits, the maximum clock frequency is denoted as Fmax, which is the maximum clock frequency (at a given supply voltage) for pipeline circuits to operate properly. If the supply voltage droops too much because of switching activity, then critical paths will incur timing failure. Thus the output clock frequency is selected based on the lowest voltage that is anticipated in view of voltage droops. Another way to understand this issue is that there has to be a sufficient nominal voltage margin to handle Vdd droops. However, if the voltage margin is raised too high, then the power consumption increases and power is wasted.

Attempts have been made to reduce the performance penalty associated with supply droops. For the Intel 1A Nehalem family of processors the power supply impedance profile has a $1^{st}$ and $2^{nd}$ order droop regions, where the $1^{st}$ order droop occurs at a much higher frequency than the $2^{nd}$ order droop region. The Intel 1A Nehalem family of multi-core processors adapts the output frequency of the PLL primarily in response to the high frequency $1^{st}$ order supply droops using adaptive analog frequency/supply tracking. As illustrated in FIG. 2, the Nehalem approach includes a resistively coupled analog tracking loop to adjust a linear voltage regulator of the PLL. Details of the Nehalem approach are discussed in U.S. Pat. No. 7,042,259 and in the paper, "Next Generation Intel Micro-architecture (Nehalem) Clocking Architecture," by Kurd et al, 2008 Symposium on VLSI Circuits Digest of Papers, pp. 62-63. Note that the Nehalem approach, which is based on adapting to the fast $1^{st}$ order droop, attempts to stay locked with an average fixed ratio of average frequency.

Therefore, in view of these deficiencies, a new approach to generating clock signals is desired.

SUMMARY OF THE INVENTION

A clock signal generation circuit includes a phase locked loop. The output clock signal is provided to a digital system. The impedance response of the packaged digital system generates high frequency (1st order) droops and lower frequency (2nd order droops. The average clock frequency may be adjusted in response to the lower frequency (slow path) changes in VDD. The power supply voltage, VDD, of the digital system is monitored and the average clock frequency is scaled based on the changes occurring in VDD. The average clock frequency may be scaled to approximate a maximum (zero margin) system frequency, Fmax. An additional optional fast path response may be provided to address high frequency transients.

One embodiment of a method includes monitoring changes to a power supply voltage, VDD, of a digital system. The output clock frequency is dynamically scaled based on the measured changes to VDD.

Another embodiment of a method includes performing a process to determine an offset to define a relationship between VDD and a maximum operating frequency, Fmax, of a digital system. Changes to VDD are monitored during operation of the digital system. The output clock frequency of the PLL/FFL generation circuit is scaled based on the measured changes to VDD using the determined relationship in order to select a maximum clock frequency for the monitored VDD.

In an embodiment of an apparatus, a clock signal generation circuit includes a phase locked loop having a clock reference input that generates an output clock signal provided to a digital system. A clock adjustment controller generates a feedback control signal to the phase locked loop to adjust an average output clock frequency to scale to changes in a power supply voltage. In one embodiment the clock frequency is selected based on a relationship between VDD and a maximum system clock frequency, Fmax.

DETAILED DESCRIPTION

The present invention is generally directed to systems, methods, and circuits for an improved Dynamic Voltage Frequency Scaling (DVFS) PLL/FLL to adapt a clock frequency to power supply transients. The clock frequency supplied to a digital circuit is dynamically scaled to track changes in VDD power supply noise as a digital system operates. The clock frequency is dynamically scaled to track at least the lower frequency (slow path) VDD transients. One aspect is that adapting the clock frequency helps to avoid setup/hold time in a digital system with significant noise present on its VDD supply and offers potential performance advantages in terms of speed and power.

Block Diagrams

Figure 1:
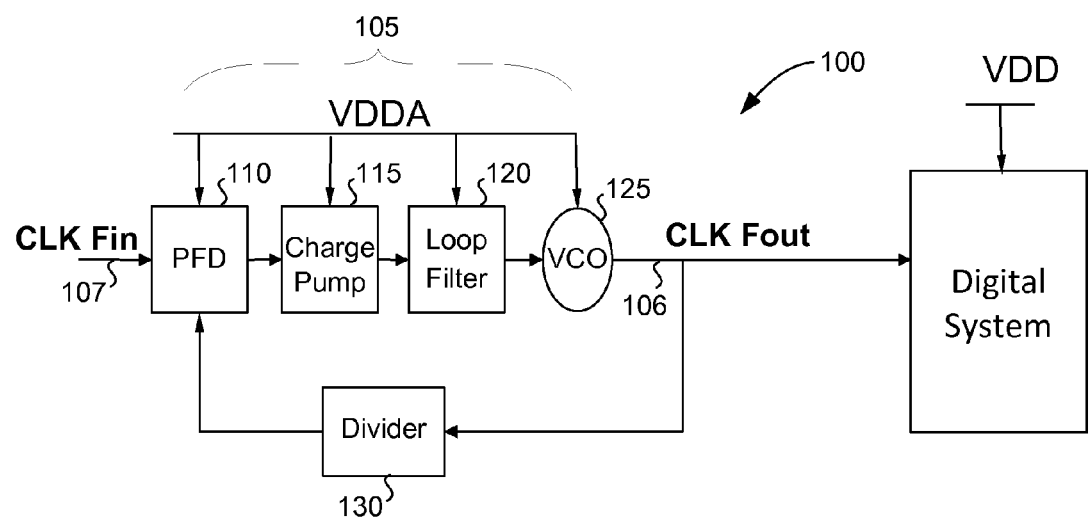
FIG. 1 illustrates a prior art PLL clock generation circuit.
Figure 2:
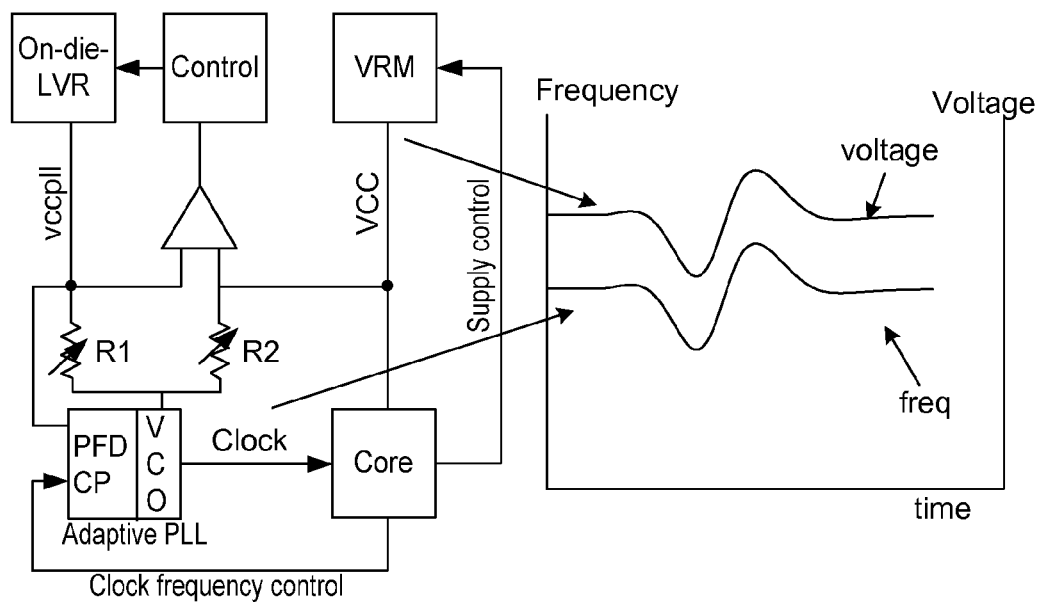
FIG. 2 illustrates a prior art Nehalem approach to partially adapt a PLL clock generation circuit to power supply voltage transients.
Figure 3:
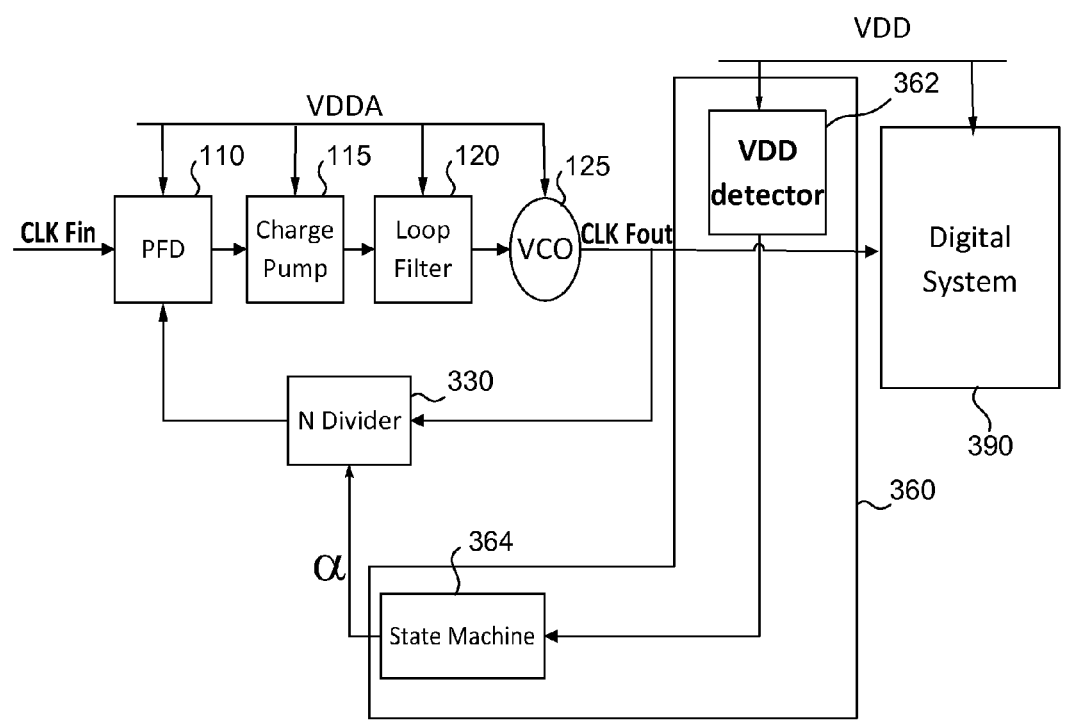
FIG. 3 is a high level block diagram a PLL/FLL circuit of the present invention in accordance with an embodiment of the present invention.

FIG. 3 is a block diagram of a Dynamic Voltage Frequency Scaling (DVFS) PLL/FLL 300 in accordance with an embodiment of the present invention. The DVFS PLL/FLL 300 is a noise aware PLL circuit. The PLL circuit supplies a clock signal to a digital system 390 having a power supply voltage of VDD. As the digital system 390 operates the current (i) of the digital system switches and there will be di/dt noise associated with the impedance of the packaged digital system. The impedance includes capacitive and inductive components, which in turn generate $1^{st}$ and $2^{nd}$ order droops. In modern graphics systems the nominal VDD can be close to 1 V and the droop can exceed 200 mV if a fixed clock frequency is used.

The DVFS PLL/FLL 300 includes conventional PLL/FLL components such as a PFD/FD 110, charge pump 115, loop filter 120, and VCO 125. A divider 330 is modified over the prior art to receive an additional adjustment signal from clock frequency adjustment unit 360. Clock frequency adjustment circuit 360 monitors VDD noise and generates a fractional signal, α, that adjusts the clock frequency, CLKFout, in response to VDD noise.

In one embodiment the voltage of the digital circuit domain, (VDD), is detected by a VDD detector 362. The VDD detector detects the VDD voltage change and converts it into a digital signal, which is fed to a state machine 364. The state machine 364, in turn, generates the fractional signal a and provides it to the divider 330 of the PLL circuit to adjust the output clock frequency. The state machine 364 converts the supply voltage change to a frequency change by updating a feedback divider number. The state machine 364 selects a clock frequency which decreases the clock frequency when the supply voltage drops and vice-versa. The response is tailored to optimize one or more performance metrics.

The state machine 364 may be implemented using any technique used in analog and digital circuit design to implement a state machine. As examples, a hardware implementation may include programmable hardware, such as a programmable logic device, a programmable logic controller, logic gates and flip flops or relays. A hardware implementation may include a register to store state variables, and combinational logic blocks to determine state transitions and the outputs of the state machine.

The VDD detector 362 includes a voltage detector such as an analog-to-digital converter (ADC) to measure the digital power supply voltage in real time. The state machine 364 performs adjustments that track the $2^{nd}$ order (lower frequency, slow path) transient response. Thus the average frequency of the output clock will vary in time as the digital power supply variation caused by noise, but will still be pseudo-locked to the input reference clock for clock generation. The state machine 364 may be programmed to cause the variation in clock frequency to improve one or more digital circuit performance metrics. In one embodiment the state machine 364 utilizes empirical data during a testing phase to adjust parameters of a programmable algorithm to adjust the clock frequency in response to voltage droops and overshoots to optimize one or more digital circuit attributes, such as power consumption, operating system, speed, etc. For example a tracking function in which the clock frequency is a function of supply voltage may be used, such as a polynomial equation or other parametric equation having coefficients that may be adjusted during a testing phase to optimize one or more performance metrics. In particular, in one embodiment the state machine decreases the frequency of the clock when power supply voltage droops and increases the clock frequency when supply voltage overshoots. The average clock frequency may be varied to track changes in the low frequency power supply noise such that the clock frequency is selected to closely track an estimated safe critical path frequency limit that minimizes the voltage margin.

Figure 4:
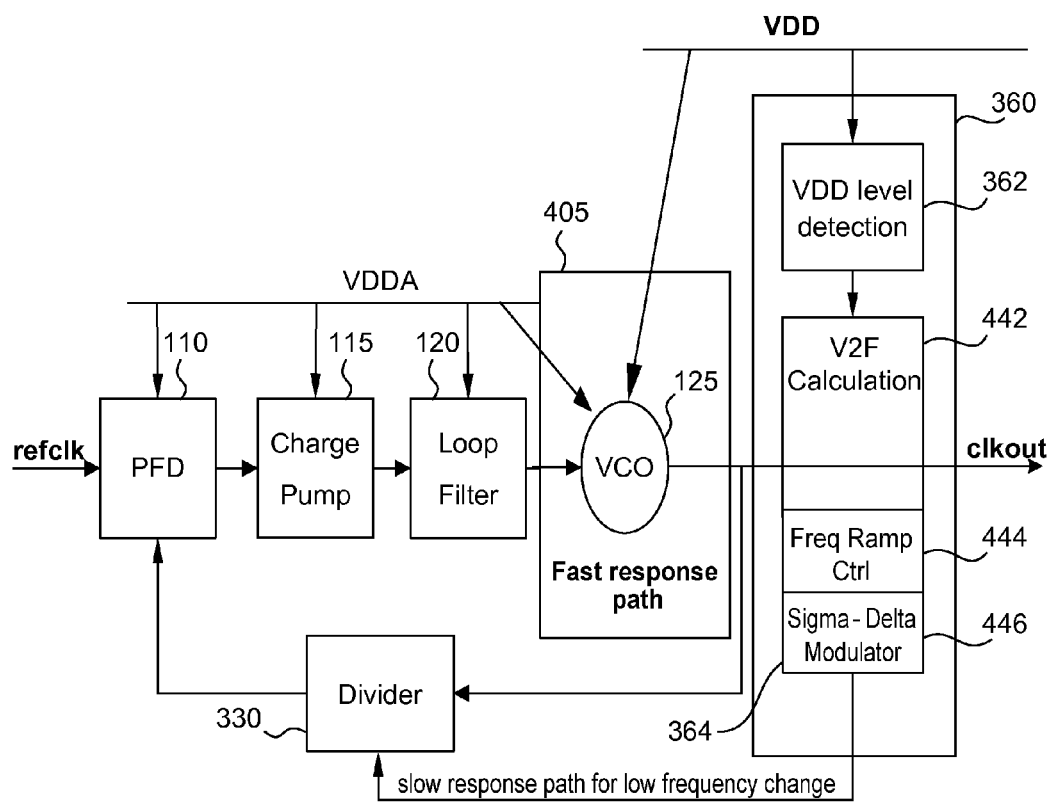
FIG. 4 illustrates a block diagram of a PLL/FLL circuit having an additional optional fast path block.

FIG. 4 illustrates in more detail an example of an implementation of the circuit of FIG. 3 in accordance with an embodiment of the present invention. The clock frequency adjustment unit 360 includes a VDD level detector to detect and measure VDD variations in real time. The VDD detector converts VDD variation in real-time analog data to digital data, in which it will be processed by the state machine. The state machine 364 performs multiple functions. First, the state machine will perform a calibration to remove any offset in the VDD detector. Then, the state machine processes digital data from VDD detector to translate real time VDD changes to desired frequency changes (V2F calculation) 442 and a frequency ramp controller 444 to determine a ramp response for the clock frequency. And, lastly, the state machine modulates the coefficient of the N divider by means of a Sigma-Delta modulator 446 technique to generate a signal (a fractional coefficient, α) to achieve very high frequency resolution at the output clock. This results in an output clock frequency (Fout), which is determined by following formula:

$$Fout = Fin \times (N+\alpha)$$

In the embodiment of FIG. 4, an optional fast response path 405 may be included to deal with the $1^{st}$ order (fast) drooping. This may include any suitable technique known in the art to minimize the performance impact of the $1^{st}$ order (fast) drooping. In contrast, the clock frequency adjustment circuit 360 is directed at the slower $2^{nd}$ order drooping, which is slow enough in response to permit the clock frequency to be adapted in response thereto.

Illustrative Methodology of Use

Dynamic adjustment of the clock frequency provides performance benefits, which may include increasing the maximum operating frequency of the system, achieving higher average speed, and improved power performance. One aspect is that this clock frequency change helps to avoid setup/hold time in a digital system with significant noise present on its VDD supply.

A general relationship between supply voltage and clock frequency may be defined and used to determine the output clock frequency for a given supply voltage. However, in practice, an empirical offset may be included to account for processing variations between different chip runs and/or individual chips.

In one embodiment a process may be supported to define the offset required to have an accurate relationship between maximum clock frequency and supply voltage. The clock frequency may be selected to be close to a maximum frequency consistent with a critical path limit. This can also be described as dynamically selecting the clock frequency to be close to an unmarginalized (no voltage margin) Fmax of the digital system for the detected VDD.

Figure 5:
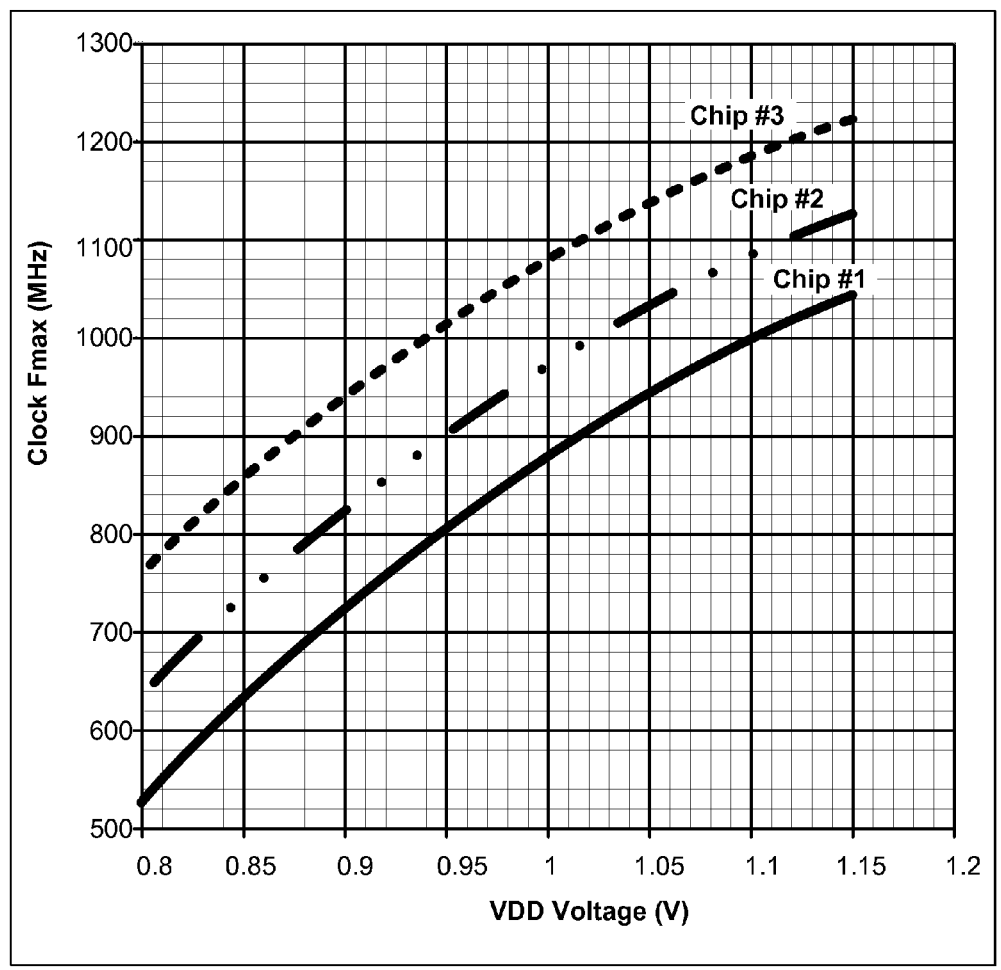
FIG. 5 illustrates aspects of characterizing a chip during a testing phase to determine an offset to parameters for operating the PLL/FLL circuit in accordance with an embodiment of the present invention.

FIG. 5 illustrates example of three plots of unmarginalized (no extra voltage margin) maximum clock frequency (Fmax) vs supply voltage VDD for three different chip runs of a digital system. As can be seen, there may be significant variations in different chip runs, with some chips being inherently faster than others for a given voltage. Thus, while a general equation can be defined to describe the shape of the curves, there are empirical offset in individual chips. A characterization process can be performing during chip testing to determine an offset to the relationship between an unmarginalized maximum system frequency, Fmax, and VDD for an individual chip. The parameters of the relationship and the offset may, for example, be stored on chip and used to define the voltage to frequency relationship used by the state machine. Thus, in on embodiment, this process permits the clock frequency to be selected to be a close approximation of an optimum Fmax for the detected VDD.

Figure 6:
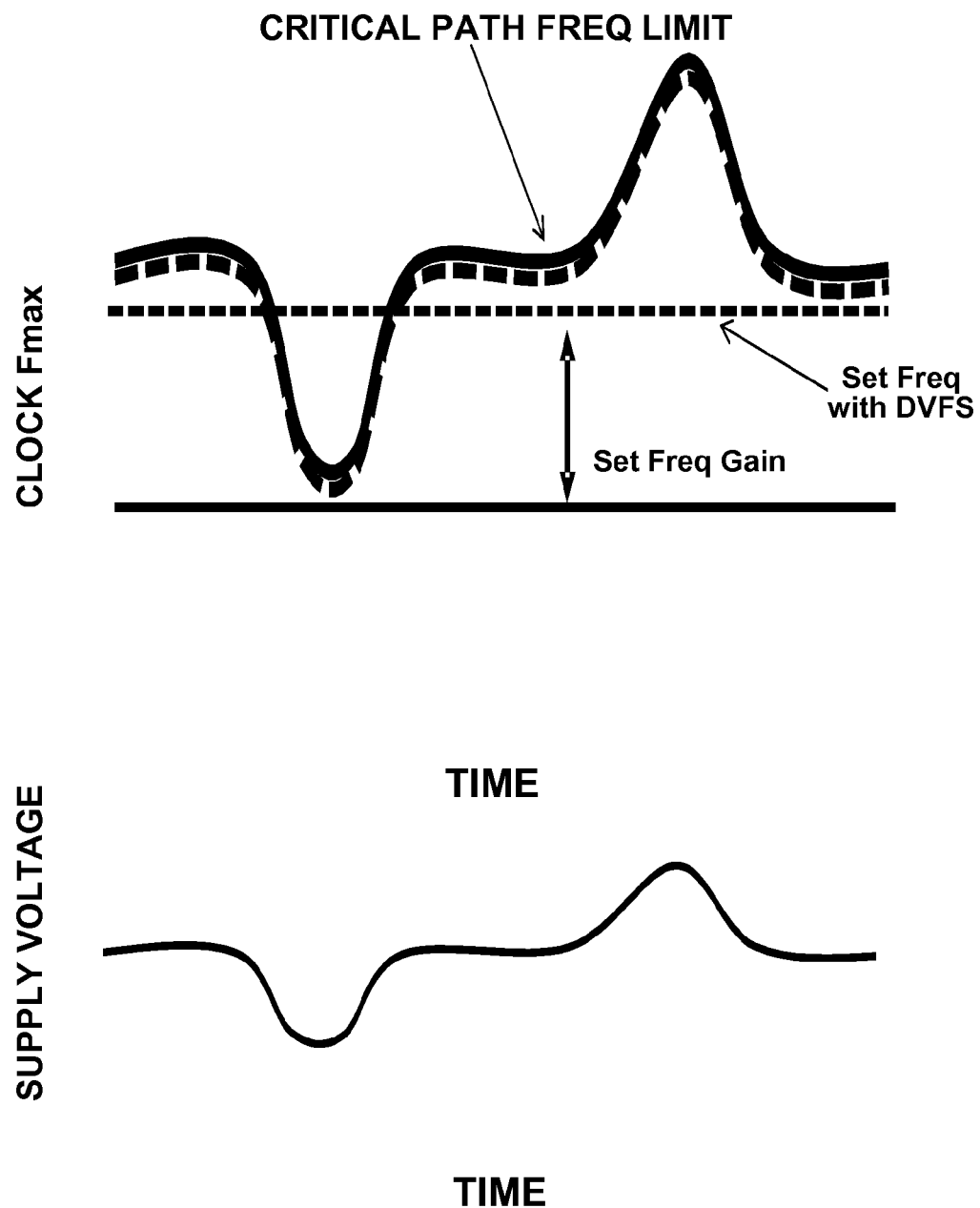
FIG. 6 illustrates a method of selecting the clock frequency based on the critical path limit in accordance with an embodiment of the present invention.

Referring to FIG. 6, the clock frequency, at a given supply voltage, may be set to be slightly below a critical path frequency limit (e.g., within a safety threshold to be slightly below the critical path frequency limit) In the prior art the Fmax is set a constant level corresponding to the minimum supply voltage. However, in the present invention the frequency is dynamically adapted to track the supply voltage and approximates the instantaneous upper limit permitted for the time-varying supply voltage. As a result, there is a frequency gain in terms of average frequency set with DVFS in comparison with the prior art approach of setting a fixed clock frequency. Moreover, this approach also results in the output clock frequency being selected to minimize a voltage margin.

The approach has been empirically tested. A test circuit was able to track large VDD transients up to 200 mV and respond with a large frequency variation range, >20%. Additionally, since there is programmable gain of VDD noise sensitivity the characteristics can be optimized for an individual chip by determining an offset during a test phase. Moreover, the programmable nature means that, if desired, there is an optional capability to revert to the operation of a conventional PLL by "turning off" the output of the state machine.

Alternate Embodiments

It will be understood that variations on the PLL circuit design are contemplated. While an analog PLL circuit design is illustrated, it will be understood that variations on the analog circuitry are contemplated. Additionally, it will be understood that the present invention is not limited to an analog circuit design. Digital circuit equivalents are also contemplated.

While the invention has been described in conjunction with specific embodiments, it will be understood that it is not intended to limit the invention to the described embodiments. On the contrary, it is intended to cover alternatives, modifications, and equivalents as may be included within the spirit and scope of the invention as defined by the appended claims. The present invention may be practiced without some or all of these specific details. In addition, well known features may not have been described in detail to avoid unnecessarily obscuring the invention. In accordance with the present invention, the components, process steps, and/or data structures may be implemented using various types of operating systems, programming languages, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. The present invention may also be tangibly embodied as a set of computer instructions stored on a computer readable medium, such as a memory device.

What is claimed is:

1. A method of operating a PLL/FLL clock generation circuit, comprising:
   providing an output clock signal to a digital system;
   monitoring changes to a level of a power supply voltage VDD that is provided to the digital system to produce measured VDD changes;
   generating a fractional adjustment signal based on the measured VDD changes; and
   dynamically adapting a frequency of the output clock signal of the PLL/FLL clock generation circuit by a divider that receives the output clock signal and the fractional adjustment signal.

2. The method of claim 1, wherein the frequency is selected to approximate a maximum frequency of the output clock, Fmax, for the measured VDD changes.

3. The method of claim 1, wherein the frequency is selected to minimize a voltage margin of the power supply voltage VDD.

4. The method of claim 1, wherein the measured VDD changes are converted in real-time from analog data to digital data.

5. The method of claim 1, wherein said dynamically adapting the frequency includes utilizing a state machine to determine the fractional adjustment signal.

6. The method of claim 1, a divider is configured to receive the output clock signal and the fractional adjustment signal to adjust an average frequency of the output clock signal.

7. The method of claim 1, wherein dynamically adapting the frequency includes determining a maximum clock frequency for the measured VDD changes and adjusting a response of a divider within the PLL/FLL clock generation circuit.

8. The method of claim 1, further comprising determining, for an individual chip, a relationship between the VDD and a maximum frequency of the output clock provided to the digital system, wherein the determined relationship is used to select the frequency.

9. The method of claim 8, wherein the determining comprises determining an offset to the relationship between the VDD and the maximum frequency for the individual chip.

10. A method of operating a PLL/FLL clock generation circuit, comprising:
    determining an empirical offset to a relationship between a power supply voltage VDD and a maximum operating frequency, Fmax, associated with a digital system;
    monitoring changes to a level of the power supply voltage VDD that is provided to the digital system to produce measured VDD changes during operation of the digital system;
    generating a fractional adjustment signal based on the measured VDD changes; and
    dynamically adapting a frequency of an output clock signal of the PLL/FLL generation circuit by a divider that receives the output clock signal and the fractional adjustment signal, wherein the output clock frequency is selected based on the determined relationship to select a maximum clock frequency for the output clock signal.

11. The method of claim 10, wherein the frequency of the output clock is selected to minimize a voltage margin.

12. The method of claim 10, wherein the frequency of the output clock is dynamically adapted based on the low frequency changes to VDD.

13. The method of claim 10, wherein said dynamically adapting the frequency of the output clock includes utilizing a state machine to determine the fractional adjustment signal.

14. The method of claim 10, wherein dynamically adapting the frequency of the output clock includes determining a maximum clock frequency for the measured VDD and providing the fractional adjustment signal to an ×N frequency divider within the PLL/FLL clock generation circuit to implement the maximum clock frequency.

15. A PLL/FLL clock generation circuit, comprising:
   a phase/frequency locked loop configured to receive a clock reference input signal and generate an output clock signal that is provided to a digital system, the phase/frequency locked loop comprising:
      a divider block configured to receive the output clock signal and a fractional adjustment signal; and
      a clock adjustment controller configured to detect changes in a level of a power supply voltage VDD that is provided to the digital system and generate a feedback control signal as the fractional adjustment signal to adjust an average frequency of the output clock signal.

16. The PLL/FLL clock generation circuit of claim 15, where the the average frequency of the output clock signal adapts to changes in VDD while maintaining a pseudo-lock to the input clock reference input signal.

17. The PLL/FLL clock generation circuit of claim 16, wherein the clock adjustment controller further comprises a Sigma-Delta modulator configured to generate the fractional adjustment signal.

18. The PLL/FLL clock generation circuit of claim 15, wherein the clock adjustment controller includes an analog voltage detector configured to detect and measure the changes to the level of a power supply voltage VDD and produce measured VDD changes and an analog-to-digital converter to convert the measured VDD changes in real-time from analog data to digital data.

19. The PLL/FLL clock generation circuit of claim 15, wherein the clock adjustment controller further comprises a voltage to frequency calculation module configured to select a clock frequency for the output clock signal based on a relationship between VDD and a maximum operating frequency, Fmax, associated with the digital system.

20. The PLL/FLL clock generation circuit of claim 19, wherein the relationship between VDD and the maximum operating frequency includes an offset determined based on testing the PLL/FLL chip generation circuit.

* * * * *